(12) United States Patent
Kochergin et al.

(10) Patent No.: US 7,254,286 B2
(45) Date of Patent: Aug. 7, 2007

(54) MAGNETO-OPTICAL RESONANT WAVEGUIDE SENSORS

(75) Inventors: Vladimir Kochergin, Westerville, OH (US); Philip Swinehart, Westerville, OH (US); Mokhtar Maklad, Westerville, OH (US)

(73) Assignee: Lake Shore Cryotronics, Inc., Westerville, OH (US)

( * ) Notice: Subject to any disclaimer, the term of this patent is extended or adjusted under 35 U.S.C. 154(b) by 0 days.

(21) Appl. No.: 11/273,259

(22) Filed: Nov. 15, 2005

(65) Prior Publication Data

US 2006/0103380 A1 May 18, 2006

Related U.S. Application Data

(63) Continuation-in-part of application No. 10/316,192, filed on Dec. 11, 2002, now Pat. No. 7,106,919.

(60) Provisional application No. 60/627,907, filed on Nov. 16, 2004.

(51) Int. Cl.
*G02F 1/295* (2006.01)
*G02B 6/00* (2006.01)

(52) U.S. Cl. .......................... 385/6; 385/12

(58) Field of Classification Search .......... 385/6, 385/29, 132, 12; 359/280
See application file for complete search history.

(56) References Cited

U.S. PATENT DOCUMENTS

| | | |
|---|---|---|
| 5,319,725 A | 6/1994 | Buchmann et al. |
| 5,493,220 A | 2/1996 | Oliver et al. |
| 5,631,559 A | 5/1997 | Oliver et al. |
| 5,736,856 A | 4/1998 | Oliver et al. |
| 5,982,174 A | 11/1999 | Wagreich |
| 5,994,898 A | 11/1999 | DiMarzio et al. |
| 6,143,435 A | 11/2000 | Il"Yashenko et al. |
| 6,192,177 B1 | 2/2001 | Amundson et al. |
| 6,233,263 B1 | 5/2001 | Chang-Hasnain et al. |
| 6,262,949 B1 | 7/2001 | Inoue et al. |
| 6,285,812 B1 | 9/2001 | Amundson et al. |
| 6,534,977 B1 | 3/2003 | Duncan et al. |
| 2002/0054424 A1* | 5/2002 | Miles ..................... 359/291 |
| 2003/0133657 A1* | 7/2003 | Kochergin et al. ........... 385/37 |

OTHER PUBLICATIONS

Wang, C.L., C.S. Tsai, "Integrated Magnetooptic Bragg Cell Modulator in Yttrium Iron Garnet-Gadolinium Gallium Garnet Taper Waveguide and Applications", Journal of Lightwave Technology, vol. 15, No. 9, 1708-15 (1997).*

(Continued)

*Primary Examiner*—Brian Healy
*Assistant Examiner*—Charlie Peng
(74) *Attorney, Agent, or Firm*—Nixon & Vanderhye PC

(57) ABSTRACT

A waveguide magneto-optic sensor provides a signal indicative of the value and/or direction of a detected magnetic field by a spectral shift of the characteristic resonant spectral feature of the sensor is disclosed. The sensor does not suffer from vibrations, fiber bending or other light intensity noise and provides an absolute self-referencing signal. The sensor elements can easily be coupled to optical fibers and read with scanning spectrometers or scanning lasers calibrated against NIST-traceable gas absorption standards.

33 Claims, 7 Drawing Sheets

OTHER PUBLICATIONS

Kano H., et al., "Optimized Structure of Sputter Garnet Disks", IEEE Transactions of Magnetics, Vo. 25, No. 5, 3737-40 (1989).*

J.L. Arce-Diego, et al., "Fiber Bragg grating as an optical filter tuned by a magnetic field," *Optics Letters*, vol. 22, No. 9, pp. 603-605 (May 1, 1997).

Nobuki Itoh, et al., "Small optical magnetic-field sensor that uses rare-earth garnet films based on the Faraday effect," *Applied Optics*, vol. 38, No. 10, pp. 2047-2052 (Apr. 1, 1999).

Merritt N. Deeter, "Fiber-optic Faraday-effect magnetic-field sensor based on flux concentrators," *Applied Optics*, vol. 35, No. 1, pp. 154-157 (Jan. 1, 1996).

A. Yu, et al., "Practical Sagnac interferometer based fibre optic current sensor," *IEE Proc.-Optoelectron*, vol. 141, No. 4, pp. 249-256 (Aug. 1994).

M. N. Deeter, et al., "Magneto-Optic Magnetic Field Sensor With 1.4pT/√(Hz) Minimum Detectable Field at 1 kHz," *Electronics Letters*, vol. 29, No. 11, pp. 993-994 (May 27, 1993).

M. N. Deeter, et al., "Magneto-Optic Magnetic Field Sensors Based on Uniaxial Iron Garnet Films In Optical Waveguide Geometry," *IEEE Transactions on Magnetics*, vol. 29, No. 6, pp. 3402-3404 (Nov. 1993).

M.J. Steel, et al., "Large Magnetooptical Kerr Rotation with High Reflectivity from Photonic Bandgap Structures with Defects," *Journal of Lightwave Technology*, vol. 18, No. 9, pp. 1289-1296 (Sep. 2000).

M.J. Steel, et al., "Photonic Bandgaps with Defects and the Enhancement of Faraday Rotation," *Journal of Lightwave Technology*, vol. 18, No. 9, pp. 1297-1308 (Sep. 2000).

M. Vallet, et al., "The Malus Fabry-Perot interferometer," *Optics Communication 168*, pp. 423-443 (Sep. 15, 1999).

Mitsuteru Inoue et al., "Magneto-optical properties of one-dimensional photonic crystals composed of magnetic and dielectric layers," *Journal of Applied Physics*, vol. 83, No. 11, pp. 6768-6770 (Jun. 1, 1998).

Mitsuteru Inoue et al., "One-dimensional magnetophotonic crystals," *Journal of Applied Physics*, vol. 85, No. 8, pp. 5768-5770 (Apr. 15, 1999).

S. Sakaguchi et al., "Transmission Properties of Multilayer Films Composed of Magneto-Optical and Dielectric Materials," *Journal of Lightwave Technology*, vol. 17, No. 6, pp. 1087-1092 (Jun. 1999).

J. Blake, et al., "In-Line Sagnac Interferometer Current Sensor," *IEEE Transactions on Power Delivery*, vol. 11, No. 1, pp. 116-121 (Jan. 1996).

Rochford et al, "Faraday effect current sensor with improved sensitivity-bandwidth product," Optics Letters, Nov. 15, 1994, 1903-1905, vol. 19 No. 22, USA.

Day et al, "Faraday Effect Sensors for Magnetic Field and Electric Current," SPIE, 1994, 90-95, vol. 2341, USA.

Ning et al, "Recent progress in optical current sensing techniques," Rev. Sci. Instrum., May 1995, 3097-3111, vol. 66 (5), USA.

Rose, "Playing with Fire and Fibers," Circuits & Devices, Sep. 1999, 41-46, USA.

Chan et al, "Optimal sensing of current based on an extrinsic Sagnac interferometer configuration," Optics & Lasers in Engineering, 1998, 17-24, vol. 30, USA.

Bahlmann et al, "Improved Design of Magnetooptic Rib Waveguides for Optical Isolators," May 1998, 818-823, vol. 16, No. 5, USA.

Wallenhorst et al, "Enhancement of the nonreciprocal magneto-optic effect of TM modes using iron garnet double layers with opposite Faraday rotation," J. Appl. Phys., Apr. 1995, 2902-2905, vol. 77 (7), USA.

Syvorotka et al, "Growth and characterization of Bi, PR- and Bi, Sc-substituted lutetium iron garnet films with planar magnetization for magneto-optic visualization," J. Phys. D: Appl. Phys, 2001, 1178-1187, vol. 34, USA.

Kamada et al, "Magneto-optical properties of (BiGdY)3Fe5O12 for optical magnetic field sensors," J. Appl.Phys, Nov. 15, 1994, 6801-6803, vol. 75(10), USA.

Fisher et al, "Vibration immunity and Ampere's circuital law for near perfect triangular Faraday current sensor," Meas.Sci.Technol, 1996, 1900-1102, vol. 79, UK.

Chang-Hasnain, "Tunable VCSEL," IEE J. on Selected Topics in Quantum Electronics, Nov./Dec. 2000, 978-987, vol. 6 No. 6, USA.

Harris, "Tunable Long-Wavelength Vertical-Cavity Lasers: The Engine of Next Generation Optical Networks?" IEEE EE J. on Selected Topics in Quantum Electronics, Nov./Dec. 2000, 1145-1160, vol. 6, No. 6, USA.

* cited by examiner

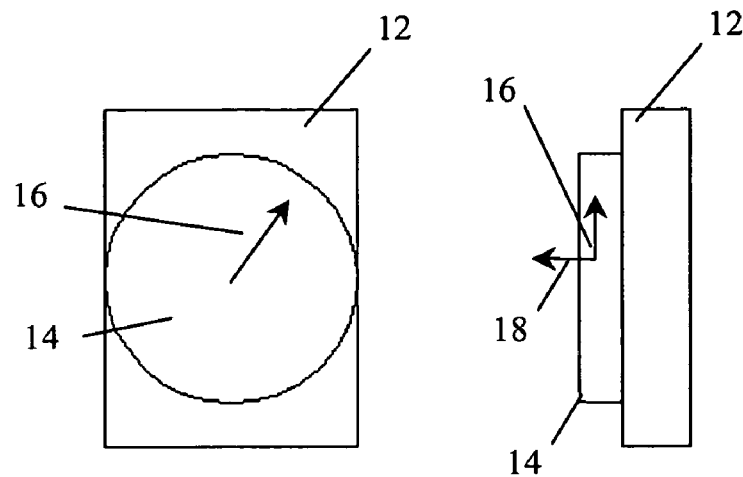
Figure 1.
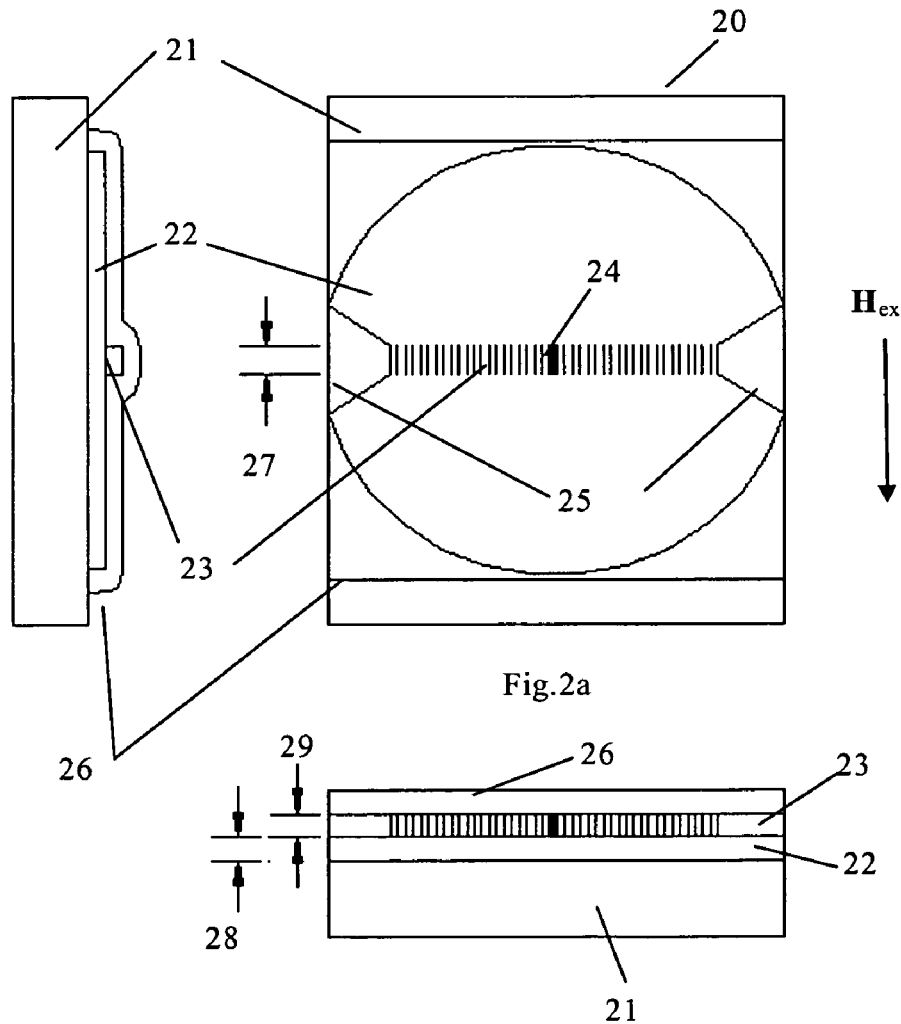
Fig.2a
Figure 2

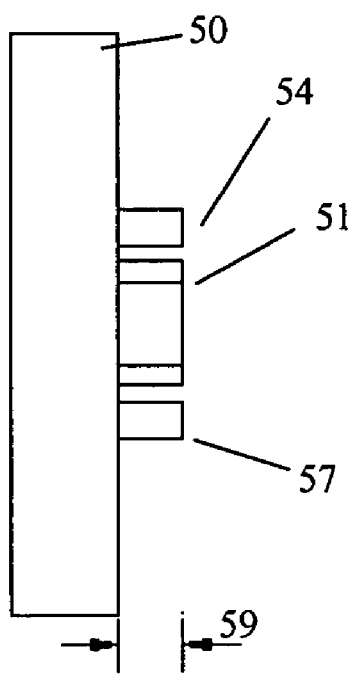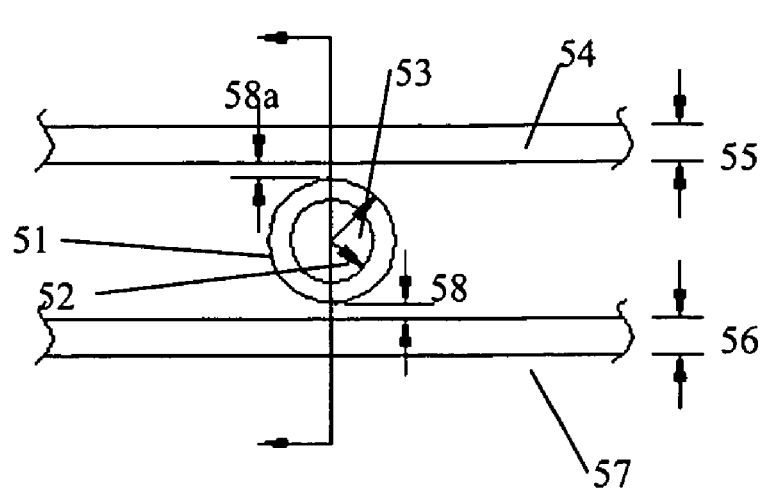
Figure 4a.
Fig. 4b

MAGNETO-OPTICAL RESONANT WAVEGUIDE SENSORS

CROSS-REFERENCES TO RELATED APPLICATIONS

This application claims the benefit of provisional application 60/627,907 filed Nov. 16, 2004, incorporated herein by reference. This application also claims the benefit of commonly assigned application Ser. No. 10/316,192 filed Dec. 11, 2002, now U.S. Pat. No. 7,106,919, of Kochergin et al. entitled "MAGNETO-OPTICAL SENSOR EMPLOYING PHASE-SHIFTED TRANSMISSION BRAGG GRATINGS" also incorporated herein by reference.

STATEMENT REGARDING FEDERALLY SPONSORED RESEARCH OR DEVELOPMENT

Not applicable.

FIELD

The technology herein is related to the optical sensing of magnetic fields, including magnetic fields generated by electrical currents. More particularly, the exemplary illustrative non-limiting technology relates to planar waveguide resonator structures, including one or more layers of magneto-optically active material, for the detection of the magnetization changes in magneto-optically active layers by spectral shifts of the characteristic waveguide resonator spectral features, and which are easily connectable to optical fibers.

BACKGROUND AND SUMMARY

Optical sensors have significant advantages over electronic sensors in many applications; for instance, those requiring absolute explosion proofing, insensitivity to electromagnetic interference (EMI), low to zero electronic emissions, high voltage exposure during electrical current measurements, and/or complete absence of metals or other electrical conductors. Sensors connected to and/or interrogated through optical fibers (fiber optic sensors; or FO sensors) are being rapidly developed, although the industry is still in its infancy.

One type of FO sensor that has been difficult to reduce to a practical industrial product is a magneto-optical fiber optic sensor (MOFO). This is perhaps partly because of the lack of magnetic sensitivity in most optical materials, lack of the proper form of materials that do have high sensitivity and partly because of the polarization-dependent nature of the sensors that can be made from existing materials.

The illustrative exemplary non-limiting technology herein provides MOFO sensors and methods of manufacture that substantially eliminate the uncertainties in the magnetic field signals due to polarization dependence, provide high signal-to-noise ratios (SNR) and replace the light intensity (amplitude) dependence of prior art MO sensors with signals based on spectral changes in the interrogating light wavelength band.

Prior art MO sensors have been based on the rotation of light polarization during transmission through a material with a high Faraday Effect (e.g., Bi-doped, yttrium-iron garnets, or Bi:YIG) (see, for example Rochford K. B., Rose A. H., Deeter M. N., Day G. W. "Faraday effect current sensor with improved sensitivity-bandwidth product." Optics Letters, vol. 19, (no. 22), November 1994, p. 1903 and Day G. W., Deeter M. N., Rose A. H.; Rochford K. B. "Faraday effect sensors for magnetic field and electric current." Proceedings of the SPIE—The International Society for Optical Engineering, vol. 2292, (Fiber Optic and Laser Sensors XII, San Diego, Calif., USA, 25-27 Jul. 1994.) 1994, p. 42), a high Verdet constant (rare-earth doped silica glass) (see, e.g., Y. N. Ning et al in "Recent progress in optical current sensing techniques", Review of Scientific Instruments 66 (5), May 1995, pp. 3097-3111), long lengths of low Verdet constant glass fiber (lengths of a kilometer or more) (see for example [Rose A. H. "Playing with fire and fibers", IEEE Circuits and Devices Magazine, vol. 15, (no. 5), IEEE, September 1999. p. 41]) or reflection from a material with a substantial Kerr effect (ferromagnetic metals) [Oliver, S. A. and C. A. DiMarzio, U.S. Pat. No. 5,736,856; U.S. Pat. No. 5,631,559; U.S. Pat. No. 5,493,220]. In the scheme attributed to Malus, the magnetic field signal from each of these sensors, whether connected by optical fiber or not, is an amplitude signal because crossed polarizers or similar techniques are used to detect the polarization rotation. The light rotated by an external magnetic field measurand is detected as a varying light intensity, or amplitude. The signals are thus vulnerable to amplitude variability and interference due to fiber bending losses, dirty connectors and other similar causes, and large inaccuracies can occur. Polarization-maintaining (PM) fiber can be used to avoid some of the errors due to spurious polarization rotation in the fiber, but cannot solve other amplitude losses. The alternative measurement technique, which employs Sagnac interferometers (J. Blake et al., IEEE Transactions on Power Delivery, Vol. 11, No. 1, January 1996; Moon Fuk Chan; Guansan Chen; Demokan M. S.; Hwa Yaw Tam "Optimal sensing of current based on an extrinsic Sagnac interferometer configuration", Optics and Lasers in Engineering, vol. 30, (no. 1), July 1998. p. 17), relies on phase measurements but is also vulnerable to amplitude and polarization variability, although not at such a high degree as the Malus scheme.

Another difficulty with prior art Faraday Effect sensors, excluding those of the type based on kilometer-length fiber coils, is that the sensors utilize either relatively large blocks of high Verdet constant glass (several centimeters) or small blocks of a high Faraday Effect material such as perpendicular magnetization Bi:YIG. Here, perpendicular magnetization is taken to mean that the magnetization vector in the material is perpendicular to the wafer plane, with no external magnetic field present. This orientation of the magnetization can be arranged if the wafer is cut from a YIG crystal boule, or if a thick YIG film is grown on a substrate wafer, such as is done with liquid phase epitaxy (LPE) on a gadolinium gallium garnet (GGG) substrate, or on an expanded lattice GGG variation doped with materials such as calcium, magnesium, zirconium or scandium. In these cases, the transmission of light is parallel to the magnetization vector and the magnetic field is detected perpendicular to the film plane. This is because the magnetization vector is constrained from rotating due to the shape anisotropy of the material block, preventing any signal from being caused by magnetic fields perpendicular to the light path. In particular with the YIG Faraday Effect sensors, the sensor may be made up of several components (AIRAK, Inc. U.S. Pat. No. 6,534,977) and then glued or otherwise mounted to the fiber, making a fragile and unreliable sensor.

Still further difficulty is found with prior art magnetic field sensors if electrical current is to be measured. With kilometer-length, low Verdet constant fibers, coils are made and the wire is passed through the center. With high voltage power cables, the only way this can be done conveniently is to deliver the sensor with a de-mountable buss bar system—a very costly method. The same is substantially true of high Verdet constant glass sensors, since the blocks of glass must be fashioned into prisms and placed around the buss bar in a robust holding assembly so the optical path circumvents the buss bar—also a very costly method. On the other hand, the YIG sensors such as those disclosed in U.S. Pat. No. 6,534,977 are essentially "point" sensors, but suffer from the need to assemble them from many components that must be kept clean and aligned in their package. This is in addition to the difficulties with amplitude, polarization and sensor robustness discussed above.

The illustrative exemplary non-limiting implementations herein provide sensors based on planar optical waveguide resonators with waveguide modes at least partially localized in the one or more layers of materials exhibiting the Faraday Effect (i.e. magneto-optical materials). The magnetization in such magneto-optical materials is preferably the in-plane type of magnetization, i.e., materials in which the magnetization vector lies in, or nearly in, the plane of the wafer from which the sensor is fashioned. Further, the optical waveguide(s) lies in the plane of the wafer as well.

Exemplary illustrative non-limiting implementations also provide MOFO sensors in which the Faraday Effect material can remain a simple plane-parallel disk shape with no cuts or corners, allowing the magnetization vector to rotate freely in the plane of the sensor disk, greatly increasing the measurement sensitivity and resolution.

Exemplary illustrative non-limiting implementations can provide MOFO sensors with very few parts (the planar chip, the fiber connections and the package) such that the sensor is robust and stable.

Exemplary illustrative non-limiting implementations may also provide MOFO sensors that convert the external field magnitude to an optical wavelength shift that is accurately and unambiguously detectable. Further, crossed polarizers are not required, and the polarization sensitivity is reduced to at least the second order, allowing polarization-maintaining fiber connections to eliminate over-all polarization dependence.

Exemplary illustrative non-limiting implementations further provide effective "point" magneto-optical sensors for the detection of magnetic fields and magnetic field gradients due to electrical currents, permanent magnets, the earth's magnetic field or any other source.

BRIEF DESCRIPTION OF THE DRAWINGS

These and other features and advantages provided by exemplary non-limiting illustrative implementations will be better and more completely understood by referring to the following detailed description in connection with the drawings, of which:

FIG. 1 is a schematic drawing of exemplary illustrative non-limiting magneto-optical film material on a substrate with in-plane and out-of-plane magnetization vectors illustrated;

FIGS. 2, 2a are an illustrative schematic drawing of an exemplary illustrative non-limiting fiber optic magnetic field sensor comprised of at least a substrate, a ferrimagnetic magneto-optical film and a structured layer comprised of a non-magneto-optical material with a planar Bragg grating etched into it, which can further incorporate at least one phase-shift, said layer serving for waveguide mode localization in the plane of the wafer;

FIGS. 4a, 4b are a schematic drawing illustrating exemplary illustrative non-limiting parameters of a waveguide ring resonator;

DETAILED DESCRIPTION

Figure 3:
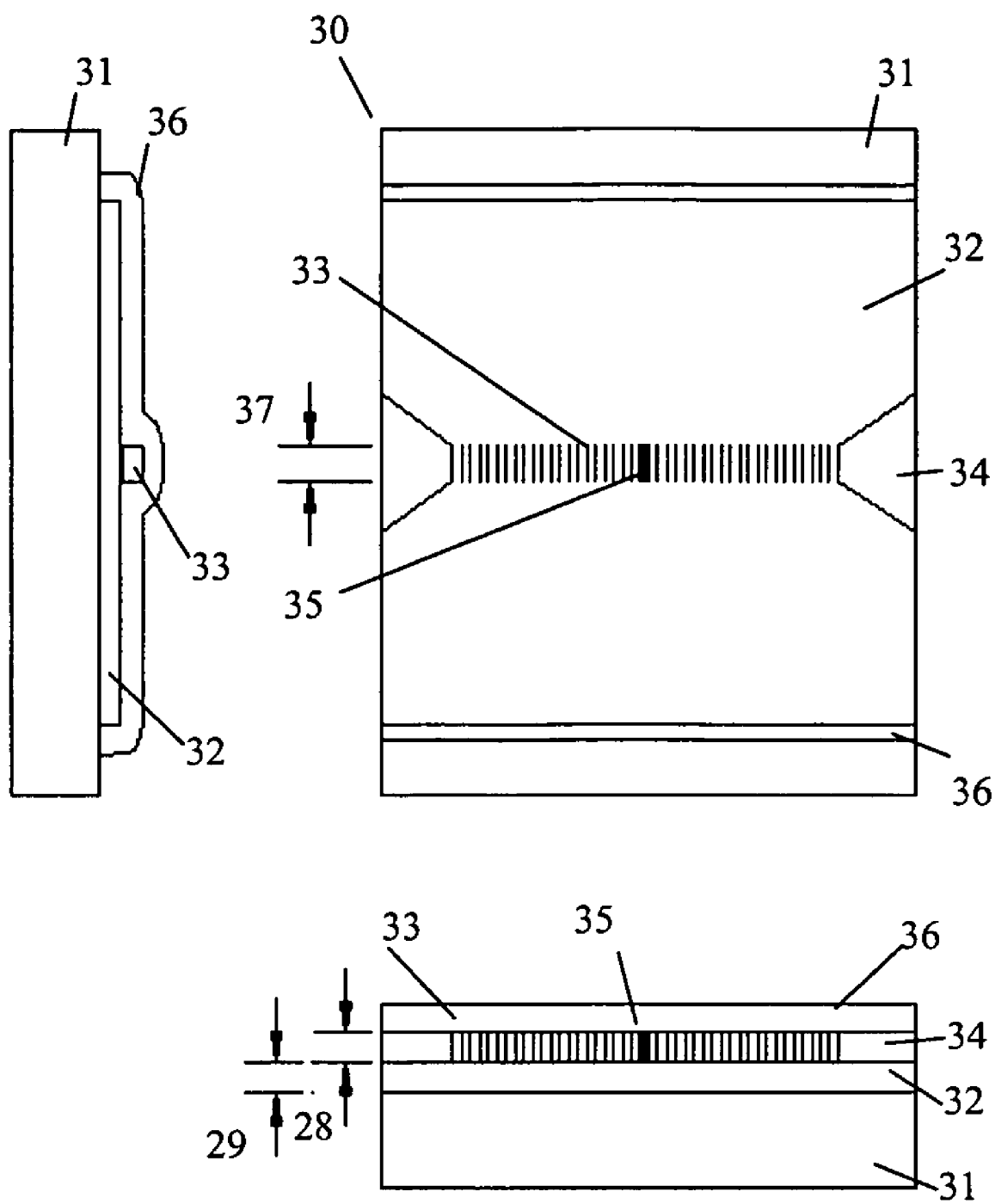
FIG. 3 is an illustrative schematic drawing of an exemplary illustrative non-limiting fiber optic magnetic field sensor comprised of at least a substrate and a paramagnetic magneto-optical film in the form of a planar waveguide further comprising a Bragg grating or a phase-shifted Bragg grating.

An exemplary illustrative non-limiting magneto-optical waveguide sensor is based on MO effects occurring in optical waveguide resonant structures with waveguide modes at least partially localized in the magneto-optical layers, which effects are the so-called nonreciprocal magneto-optic effects of transverse magnetic (TM) waveguide modes [Bahlmann N., Chandrasekhara V., Erdmann A., Gerhardt R., Hertel P., Lehmann R., Salz D., Schroteler F. J., Wallenhorst M., Dotsch H., "Improved design of magnetooptic rib waveguides for optical isolators", Journal Of Lightwave Technology 16: (5) 818-823 (1998)], [Wallenhorst M., Niemoller M., Dotsch H., Hertel P., Geghardt R., Gather B., "Enhancement of the Nonreciprocal Magnetooptic Effect of TM Modes using Iron-Garnet Double-Layers with Opposite Faraday-Rotation", JAP, 77: (7) 2902-2905 (1995)]. The physical basis of the sensing mechanism is the dependence of the effective refractive index of the TM mode in the waveguide structure containing a magneto-optical layer in the plane perpendicular to the mode propagation direction projection of the magnetization in the magneto-optical layer. This effect is nonreciprocal, i.e., sign-sensitive. Further, the exemplary illustrative non-limiting implementation provides for the conversion of said magnetization-dependent change in the effective refractive index of the TM waveguide mode into a spectral shift of a resonance spectral feature of the sensor. According to one of the aspects of the exemplary illustrative non-limiting implementation, the said conversion can be performed by fabricating a Bragg grating resonance structure in said waveguide and monitoring the change of the effective refractive index of the TM mode by the resulting change of the spectral position of the Bragg resonance, which is in turn due to changes in the value and/or direction of the external magnetic field. According to a further aspect of the exemplary illustrative non-limiting implementation, a second waveguide resonator structure in the shape of a ring or disk will also convert the magnetic field-induced change of the effective refractive index of the TM waveguide mode into a spectral change of the resonance feature position (i.e., the spectral location of the transmission valley). In all these aspects of the exemplary illustrative non-limiting implementations, the transverse electric (TE) component of the interrogating light is not affected by interaction with the magnetic material and can be used as a reference to separate the magnetic field-induced signal from the spectral shifts caused by temperature, strain or other parameter variations.

Two non-limiting example illustrative non-limiting types of magneto-optically active material are herein disclosed for the fabrication of planar waveguide structures for magnetic field sensing. Each type of material is disclosed in two main non-limiting implementations, grating waveguides and ring resonators. Although many variations in each of these implementations can be made by changes in material composition and device geometry, such alterations in no way limit the scope of the attached claims. Two example divisions of magneto-optically active materials are ferrimagnetic iron garnets and high Verdet constant glasses, which are paramagnetic, but other materials could be used as well.

Sensor design utilizing ferrimagnetic iron garnet material has to take into account the usual magnetic properties familiar to those knowledgeable in the art, such as demagnetization factors, shape and magneto-crystalline anisotropies, saturation magnetization, domain motion, Barkhausen noise, and the like. It is desirable from these points of view that the ferrimagnetic Faraday Effect materials have the magnetization vector in-plane, with the magnetization vector being either free to rotate in the plane of the substrate in response to changing magnetic fields (so-called "easy plane" type of magnetic anisotropy) or with magnetization vector (M) having a preferential and known orientation in the absence of external magnetic fields (so-called in-plane, hard axis type of anisotropy). A relatively thin film of a material, limited to several micrometers thick, is frequently necessary as one requirement to keep the magnetization vector M in the plane of the film, in the absence of the external magnetic field, by means of the demagnetization energy. If the film is too thick, the magnetization vector can swing out-of-plane even in the absence of an external magnetic field.

The iron garnet film of the exemplary illustrative non-limiting implementation is preferably grown epitaxially on a single crystal substrate, which can be matched as closely in crystal lattice constant as possible to that of the film. The MO film can be grown in disk shape or can be formed into a disk shape after growth by any etching means common in the materials processing art, the purpose of which is to avoid the formation of magnetic poles at the film periphery and thus to allow M to rotate freely under the influence of an external magnetic field.

The preferred, but not exclusive, form of a structure allowing free rotation of M is a disk with smooth surfaces and edges as shown in FIG. 1. Since the direction of M can be influenced by several physical parameters such as crystal stress and geometry, it is preferred that the single crystal garnet film (14) be thin (between 200 nm and 5000 nm), so the component of M out of the plane (18) is much smaller than the component in the plane (16) and, further, that it be supported on a substrate (12). The substrate (12) is preferably a gadolinium gallium garnet (GGG) single crystal or a variation that can include additives to enlarge the lattice to accommodate subsequent additives to the film (14) that increase its optical rotation but also enlarge the film crystal lattice, in particular bismuth. Many other additives known in the art can also be added [I. M. Syvorotka et. al, J. Phys. D: Appl. Phys. 34 (2001), pp. 1178-1187], [U.S. Pat. No. 6, 143,435 to Il'yashenko et al, Nov. 7, 2000]) such as Ce, Lu, and Gd, etc. Complicating matters, optical absorption and Faraday rotation have a close relationship, as has long been known in the art. Gallium and aluminum substitutions in the Fe site in the garnet $((BiY)_3(FeGaAl)_5O_{12})$ are usually helpful in lowering $H_k$ (increasing field sensitivity), but they lower the Faraday rotation. Bi and/or Ce substitutions into the Y site (e.g., $(BiCeY)_3Fe_5O_{12}$) cause a large enhancement of both Faraday rotation and absorption. On the other hand, a high Verdet constant, silica-based glass known in the art causes much less rotation of the interrogating light, but much more rotation than found in common glasses such as optical communications fiber. The usual additive, Tb in this case, increases the Verdet constant. Unlike iron garnets, the glass is paramagnetic, so the device utilizing the high Verdet constant glass is not restricted to a disk or ring structure, nor to thin layers, except when required as part of the resonant waveguide design.

For the purposes of exemplary illustrative non-limiting implementations, it is most desirable that the Faraday Effect material be a single crystal film in the shape of a disk with smooth surfaces, if the waveguide is to be formed with an applied, non-magnetic transparent dielectric material such as, in a nonlimiting example, silicon dioxide or a polymer. In such a design, the refractive index of the magneto-optical material should be higher than that of the substrate (such as a YIG layer with refractive index in the range of 2.2 to 2.4 on the top of GGG substrate with refractive index of about 1.9) and also higher than that of the non-magnetic transparent dielectric material (for silica, n is about 1.486). There are, however, some alternative aspects of the exemplary illustrative non-limiting implementation that would make use of an applied, non-magnetic waveguide material with a higher index than that of the YIG. The thickness of the Faraday Effect layer may be slightly less than that needed to support a single waveguide mode at the wavelength of the interrogation instrument. The applied rib waveguide structure in a transparent layer on the top of the Faraday Effect layer will help to overcome the waveguide mode cut-off size condition and will permit the guiding of the waveguide mode while keeping said mode localized mostly in the Faraday Effect material to maximize the sensitivity of the sensor to the external magnetic field. In this case, the MO material is also part of the waveguide. Alternatively, in another aspect of the exemplary illustrative non-limiting implementation, the layer exhibiting the Faraday Effect can be used as the substrate, while the waveguide mode can be mostly confined in the "rib" waveguide formed out of thicker, high refractive index material on the top of the Faraday Effect layer. In another aspect of the exemplary illustrative non-limiting implementation, the rib waveguide can be formed in the Faraday Effect layer itself by means of ion milling, reactive ion etching or any other technique well known in the art. It should be noted that it is less desirable that the waveguide be formed in the ferrimagnetic material, since sharp corners and contours will cause extraneous magnetic poles to form and adversely affect the ability of the magnetization vector to rotate freely. However, such a sensor will show some degree of sensitivity.

Another concern that we address is the matching of the optical characteristics of the input and output optical fibers and the sensor waveguides. The numerical apertures (NA) should be matched closely to minimize insertion losses, although this is not as critical in the case of sensors as it is in the case of optical communications devices. In the exemplary, illustrative, non-limiting implementation, the waveguides can be generally of either higher index of refraction than that of the fiber or physically smaller in at least one cross sectional dimension, or both. Antireflection coatings (ARC), formulated in a manner well known in the current art, can be applied to all mating optical surfaces. Both fibers and sensor waveguides can be tapered, and multiple layers of materials with differing indices of refraction (n) can be applied on top of the sensor waveguides (normal to the direction of light propagation), either completely or partially covering the waveguides.

FIG. 1 is a schematic, illustrative drawing that defines an exemplary illustrative non-limiting implementation of a garnet material 14 as the Faraday-active medium on a substrate 12. The components of the material magnetization vector, M are shown as the in-plane projection 16, viewing normal to the film plane and orthogonal projections 16 and 18 viewing in the film plane. The in-plane vector component 16 is shown in an arbitrary in-plane direction. The magnetization anisotropy can be determined by utilizing standard measurements made, as an example, on a vibrating sample magnetometer (VSM), and the rectangular or square chip can be cut perpendicular to M for reference purposes and to ease the mounting of the chip to an optical fiber. The directions of the waveguides can be chosen solely or partially with respect to the direction of the axes of the magnetic anisotropy of the magneto-optical film. The waveguide may be oriented parallel to the easy axis of the magneto-optical film and perpendicular to the hard axis of magneto-optical film in order to maximize the dynamic range of the sensor and in order to obtain linear dependence of the measured spectral shift to the applied magnetic field projection.

The component of the magnetization vector out of the plane 14 can also cause a nonreciprocal change in the effective refractive index of the TM waveguide mode. However, the influence of the film component of magnetization perpendicular to the plane of the film is typically an order of magnitude or more less than that of the in-plane magnetization component, which is oriented perpendicular to the waveguide direction. The influence of the out-of-plane M component can be further minimized by the proper design of the waveguide structure, since the sensitivity of the nonreciprocal magneto optical effect depends on the geometry of the waveguide (roughly on the ratio of the thickness of the magneto-optical layer to the width of the rib waveguide). Growing iron garnet films with the proper compositions on a substrate of proper lattice constant and proper crystal orientation can also suppress the out-of plane magnetization component considerably.

According to one exemplary illustrative non-limiting implementation, a novel magnetic field sensor suitable for coupling to an optical fiber, and further embodying properties capable of inducing a shift in the wavelength position of an optical resonance, is illustrated schematically in FIG. 2. FIG. 2 shows a grating waveguide sensor 20 comprising a MO film 22 on a substrate 21, a structured layer 23 (which serves for confinement of the waveguide mode) with a written planar Bragg grating disposed on the surface of the MO film, a phase shift element 24 at the longitudinal center of the waveguide, tapered waveguide ends 25 and a cladding 26 over the waveguide.

The structured layer 23 can be partially cut or etched into the MO film 22, by any method commonly known in the art, but in order to not interfere with the rotation of the magnetization vector, the structured layer 23 is preferably applied to the YIG surface and is of a non-magnetically active, transparent, lower index of refraction material. The grating can be formed in the layer 23 by ultraviolet photolithography, electron beam lithography, stamping or any other method known in the art.

The cladding layer 26 preferably possesses a lower index of refraction than that of the MO active material 22 or the waveguide material 23 and can be applied by sputtering, chemical vapor deposition (CVD) or any other method known in the art. Layer 26 can be comprised of multiple layers intended to protect the waveguide physically as well as to affect the characteristics of the reflected and transmitted light. Incident light from an optical fiber is partially reflected and partially transmitted, since the Bragg grating acts as a wavelength selective mirror. The degree of reflection, spectral position and spectral width of the reflected wavelength band depend, among other things, upon the length and period $\Lambda$ of the alternating index grating segments, its width 27, its overall length and the index of refraction contrast between the alternating segments of the grating, and several other parameters known in the art.

The one or more phase shift elements 24, which can be incorporated to increase the resolution of the sensor, further causes a narrow, sharp valley in the reflected Bragg resonance peak. The end tapers of the waveguides 25, which may or may not be incorporated, aid in the NA matching between the fibers and the sensor waveguide. The tapered waveguide ends 24 are of length and taper designed to match as well as possible to the numerical aperture of the attached optical fiber, and can further have partial layers applied to their top surfaces, as is commonly done in the art, to further match the numerical apertures.

FIG. 3 is an illustrative, schematic drawing of a waveguide sensor 30 comprised of a substrate 31, an optical buffer layer 32, a MO film waveguide 33 with a Bragg grating written in it, a phase shift element 35 at the longitudinal center of the grating, tapered waveguide ends 34 and a cladding 36 over the waveguide. The thickness 28 of the waveguide layer can be in the range 10 nm to 100 µm, but preferably in the range 0.2 to 20 µm. The width of the waveguide, 37, can be in the range 10 nm to 100 µm, but preferably in the range 0.2 to 20 µm.

The waveguide 33 can be made of a high Verdet constant glass doped with an element or elements to increase the magneto-optical activity of the glass, for instance, with Tb. The waveguide can further be doped with one or materials to cause the glass to be sensitive to ultraviolet light, such as germanium, and to modify the index of refraction, such as boron and phosphorus and/or aluminum. The phase shift element 35, which optionally can be incorporated, causes a narrow, sharp valley in the reflected Bragg resonance peak that can be spectrally measured with higher resolution than a broad resonance peak. The end tapers of the waveguides 34, which may be incorporated, aid in the NA matching between the fibers and the sensor waveguide. The cladding 36 can be in general a lower refractive index material that physically protects the waveguide and further confines the waveguide optical modes to the waveguide. The waveguide may be formed in the high Verdet constant glass in several ways known in the art. If, as a non-limiting example, Ge is added to the glass, the grating can be formed by exposing the waveguide to a high intensity ultraviolet light through a phase mask, as is done with fiber Bragg gratings. The waveguide can also be formed with ultraviolet photolithography through a Cr-on-glass mask or by electron beam lithography and subsequently etched partially into or completely through the high Verdet constant glass using, for example, reactive ion etching FIG. 4 is an illustrative, schematic drawing of the most important features of a ring resonator. FIG. 4a shows the resonator structure at the cross sectional point shown in FIG. 4b. Light incident in flanking waveguide 54 or 57 is coupled by means of evanescent modes into ring waveguide 51 across respective gaps 58 and 58a and either out again into the opposite flanking waveguide or back into the original waveguide. Substrate 50 supports the resonator. Only one flanking waveguide could be used, but two (plural) provides more utility. The ring 51 has an inner radius 52 and an outer radius 53, the difference of which can be greater or lesser than the flanking waveguide widths 55 and 56. Waveguide thickness 59 is chosen to control the modes and mode propagation as desired. Inner radius 52 can be made zero to form a disk resonator structure. The transmitted light of wavelength λ will have a series of valleys in the transmission spectrum, related to the ring parameters according to the following formula: $2\pi n^* L_r/\lambda = 2\pi(N+\frac{1}{2})$, where N is an integer, $n^*$ is the effective refractive index of the waveguide mode and $L_r$ is the ring pass lens, which is equal to $2\pi r$, where r is the radius of the ring. This formula is approximate since the ring has inner and outer radii and, while the r value is typically between the values of inner and outer radiuses of the ring, the exact value of r depends on the waveguide structure.

Since the effective refractive index of the waveguide mode depends on the magnetic field, the wavelength position of the exemplary valleys in the transmission will also depend on the value and direction of the applied magnetic field. Due to the nonreciprocity of the effect in the case of a perfectly circular ring, the sensitivity to the in-plane component of the external magnetic field will be very small if the external magnetic field is uniform across the ring area since the axially symmetric segments of the ring will cancel the effects of each other. However, such a resonant structure will be highly sensitive to the nonuniformity of the in-plane projection of the external magnetic field and thus can be used as a magnetic field gradient sensor. The effect of the component of magnetization perpendicular to the ring (uniform or not), however, will add up from all the segments of the ring and will thus be stronger than that from the in-plane, uniform components. Thus, waveguide ring (or disc) resonators can be used as sensors of uniform magnetic fields perpendicular to the plane of the substrate.

Figure 5:
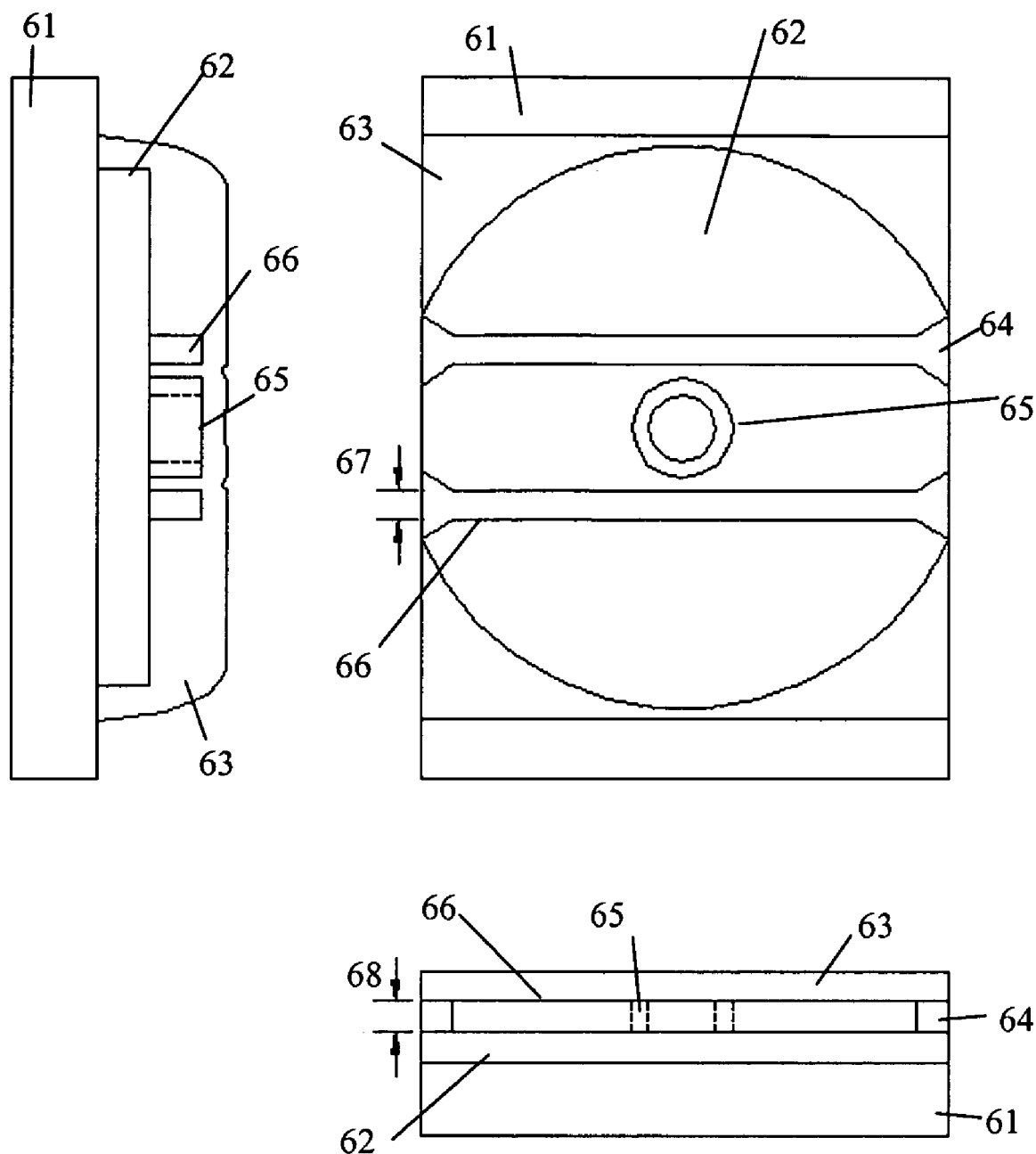
FIG. 5 shows an exemplary illustrative non-limiting fiber optic magnetic field sensor comprised of at least a substrate and a magneto-optical material in the form of a waveguide with ring resonator, said magneto-optical material being either a ferrimagnetic, large Faraday Effect material or a paramagnetic, high Verdet constant material.

FIG. 5 is a schematic, illustrative drawing of a ring or disk resonator 65, 66 made in the form of a non-magnetically active resonator structure on top of a magnetically active disk of YIG or high Verdet constant glass 62. The MO film 62 is supported on a substrate 61. A cladding layer 63 with a lower index of refraction can be applied over the resonator to further confine the waveguide modes and protect the resonator. Each flanking waveguide can be terminated in tapers 64 in order to couple more efficiently to optical fibers. The resonator structure can be cut out of a high Verdet constant MO film by etching techniques commonly known in the art, such as chemical or ion etching, and may have a non-magneto-optically active layer on top of it to confine the waveguide modes and physically protect it. An intermediate layer can be added to fill the waveguide segments that have been etched out in order to provide the desired index of refraction contrast between the segments.

Figure 6:
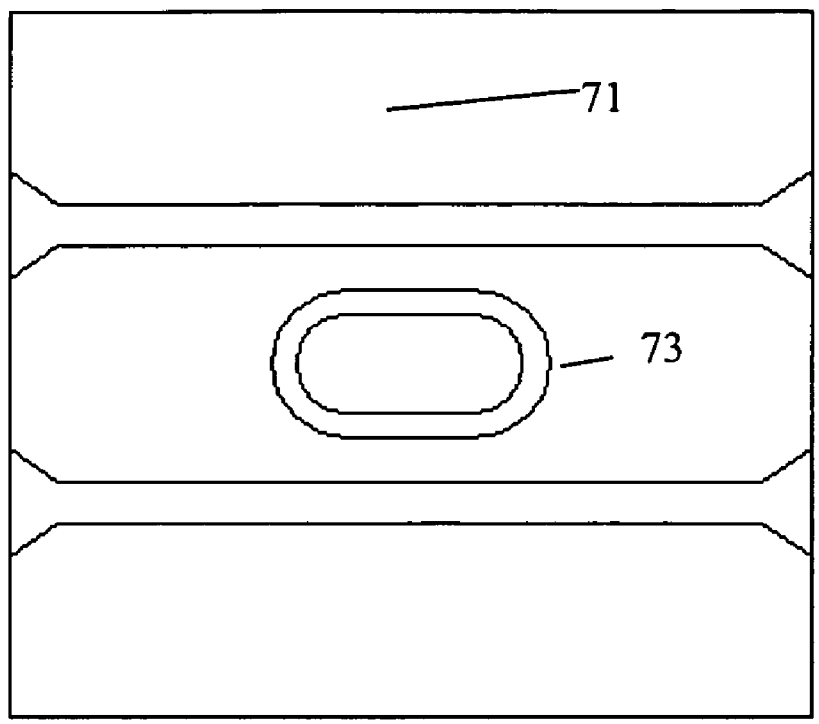
FIG. 6 is a schematic drawing illustrating one exemplary illustrative non-limiting form of a magneto-optic magnetic field sensor comprising an alternate form of waveguide and resonant ring arrangement designed to increase the coupling length between the waveguides and the ring.

FIG. 6 is an illustrative, schematic drawing of a ring resonator structure with the ring extended into an oval in order to extend the interaction length between the ring and the flanking waveguides.

Figure 7:
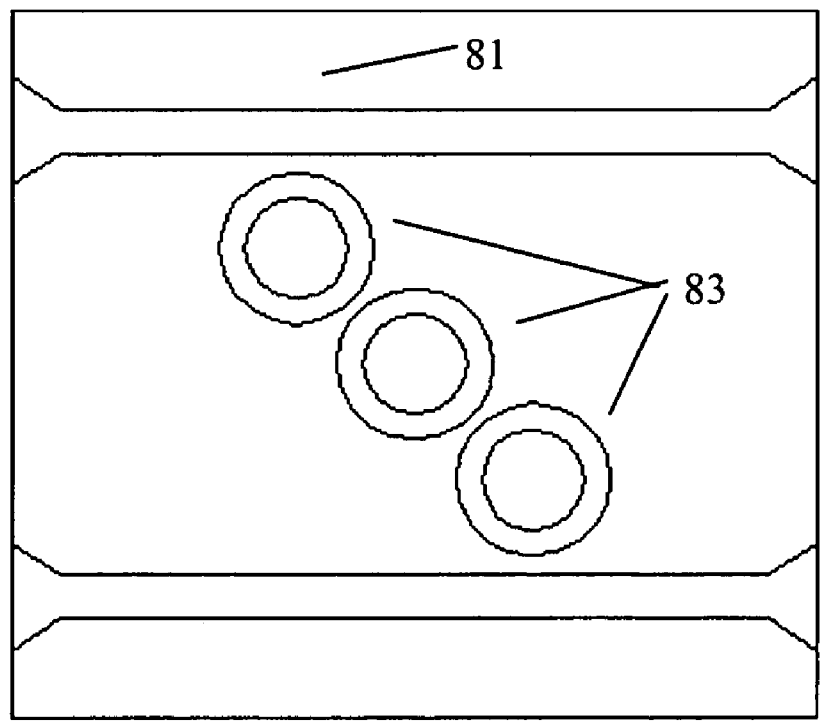
FIG. 7 is a schematic drawing illustrating an exemplary illustrative non-limiting fiber optic magnetic field sensor comprising a further alternate form of waveguide and resonant ring arrangement utilizing multiple rings that are evanescently coupled.

FIG. 7 is a further illustrative, schematic drawing of a resonator utilizing multiple coupled rings. FIGS. 6 and 7 are further non-limiting illustrations of the variety of non-exclusive configurations that can be used to accomplish magnetic field detection by the same basic means disclosed.

Figure 8:
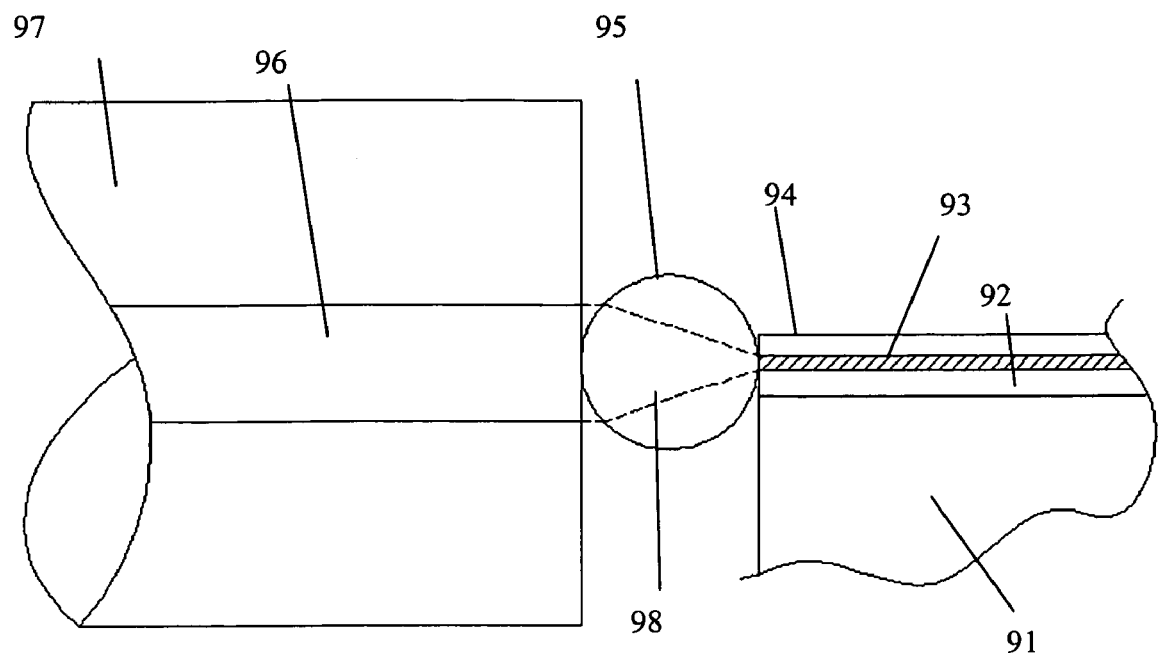
FIG. 8 is a schematic, illustrative drawing of an exemplary illustrative non-limiting method of connecting a planar waveguide, fiber optic magnetic field sensor of the ferrimagnetic type to an optical fiber.

FIG. 8 is a schematic, illustrative drawing of the cross section of a coupling means between and optical fiber and a waveguide magnetic field sensor exemplary illustrative non-limiting implementation. The fiber core 96, clad by conventional cladding 97, which can comprise a single mode fiber, is efficiently coupled to the thin planar waveguides of this exemplary implementation via a lens 95, which can be a spherical lens, a graded index lens (GRIN lens), a lensed fiber end, but preferably can be a cylindrical lens. The scales illustrated are not intended to be accurate, in order to maintain clarity. The waveguide dimension 93 can be comparable to that of the fiber core 96, or the light can be focused partly into the layer 92, if said layer is, for example, a YIG disk thinner than the mode cut-off. All elements can be supported on an additional support structure, not shown, which can be a glass or silicon V-groove structure, as commonly used in the art. The waveguide substrate 91, or conversely the waveguide cladding 94 can be attached to the support structure. Various methods of bonding the components can be utilized, including epoxy, soldering, glass frit or anodic bonding, and others known in the art. If the planar waveguide cross sectional dimensions and indices of refraction are comparable to those of the optical fiber, as is most likely in a high Verdet constant glass, the optical fiber can be mated directly to the MO sensor waveguide without intervening lenses.

Figure 9A:
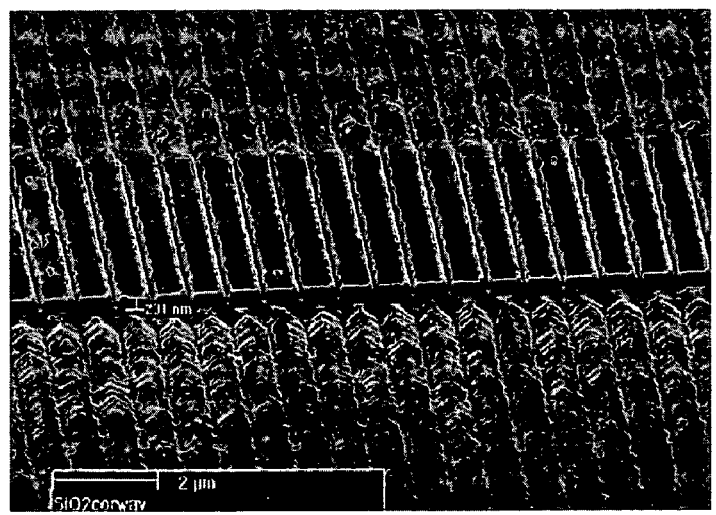
FIGS. 9a and 9b are SEM images of an exemplary illustrative non-limiting corrugated waveguides fabricated on a YIG film using photolithography and ion milling, having a Bragg grating period of 734 nm.
Figure 9B:
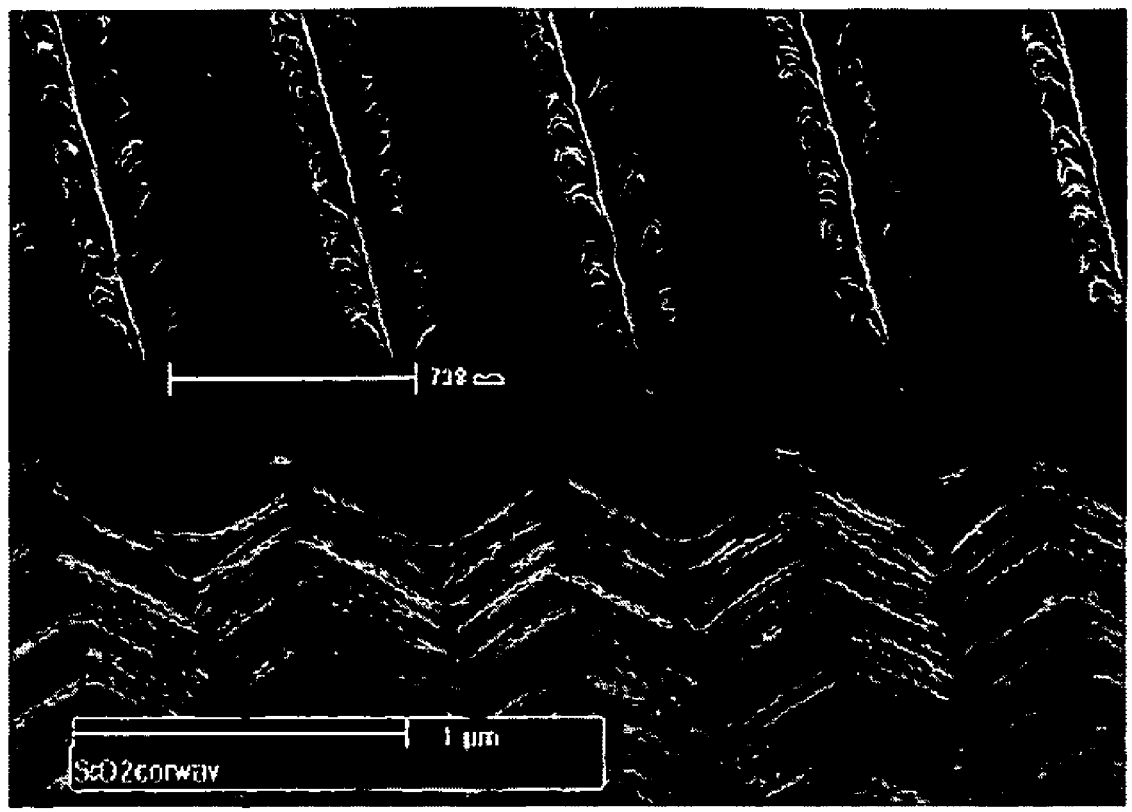

As a nonlimiting illustrative example, FIGS. 9a and 9b show SEM images of fabricated magneto-optical sensor structures of one of the implementations of the exemplary illustrative non-limiting implementation. The waveguides with Bragg gratings were fabricated on a Bi:YIG film using standard photolithography followed by ion milling. The period of Bragg grating of 734 nm was chosen to have the Bragg resonance around 1500-1560 nm.

While the technology herein has been described in connection with exemplary illustrative non-limiting implementations, the invention is not to be limited by the disclosure. The invention is intended to be defined by the claims and to cover all corresponding and equivalent arrangements whether or not specifically disclosed herein.

The invention claimed is:

1. A waveguide magneto-optical sensor element comprising:
   a substrate;
   at least one layer of magneto-optically (MO) active material disposed thereon having predetermined magnetic and magneto-optical properties;
   at least one waveguide structure supporting at least one TM-polarized waveguide mode that is at least partially localized within said at least one MO-active layer;
   at least one waveguide resonator structure for a waveguide mode formed upon at least one magneto-optically active layer such that said waveguide mode is at least partially localized in at least one MO-active layer; said waveguide resonator exhibiting a characteristic resonant spectral feature in the transmitted and reflected waves, said waveguide resonator converting the value of the magnetization of said MO-active layer into a spectral shift of the characteristic spectral feature of said resonator; and a light coupler that couples light into and out of said waveguide magneto-optical sensor element.

2. The waveguide magneto-optical sensor element of claim 1 wherein said at least one MO-active layer comprises a ferrimagnetic iron garnet film.

3. The waveguide magneto-optical sensor element of claim 2 wherein said iron garnet composition is modified with at least one element selected from the group consisting of Bi, Y, Ga, Ce.

4. The waveguide magneto-optical sensor element of claim 2 wherein said iron garnet composition is modified with at least one element selected from the group consisting of the rare earth elements.

5. The waveguide magneto-optical sensor element of claim 2 wherein the substrate comprises a monocrystalline gallium gadolinium garnet substrate.

6. The waveguide magneto-optical sensor element of claim 5 wherein the substrate comprises an expanded lattice monocrystalline gallium gadolinium garnet substrate in order to incorporate the maximum amount of bismuth in the iron garnet film.

7. The waveguide magneto-optical sensor element of claim 2 wherein the iron garnet layer comprises a single crystal layer.

8. The waveguide magneto-optical sensor element of claim 2 wherein the iron garnet layer possesses magnetic anisotropy chosen from the group consisting of in-plane anisotropy, perpendicular anisotropy, cubic anisotropy, easy-plane anisotropy.

9. The waveguide magneto-optical sensor element of claim 1 wherein said at least one MO-active layer comprises a transparent paramagnetic film.

10. The waveguide magneto-optical sensor element of claim 9 wherein said transparent paramagnetic film comprises a high Verdet constant glass.

11. The waveguide magneto-optical sensor element of claim 10 wherein said high Verdet constant glass is doped with one or more rare earth elements.

12. The waveguide magneto-optical sensor element of claim 11 wherein at least one of said rare earth dopants is terbium.

13. The waveguide magneto-optical sensor element of claim 1 wherein said waveguide structure comprises a waveguide core consisting of an MO-active layer having a refractive index higher than that of the substrate and having thickness insufficient to support a waveguide mode; and further with a structured transparent layer disposed on the top of MO-active layer, said structured transparent layer having a rib cross-section with a thickness and a width that permits the propagation of at least one TM-polarized mode in the waveguide structure in combination with the MO-active layer.

14. The waveguide magneto-optical sensor element of claim 1 wherein said waveguide structure has a core consisting of a structured MO-active layer having a refractive index higher than that of the substrate and having a rib cross-section with a thickness and width that permits the propagation of at least one TM-polarized mode in the waveguide structure.

15. The waveguide magneto-optical sensor element of claim 1 wherein said waveguide structure has a core consisting of a structured non-magneto-optical transparent layer disposed on top of the MO-active layer, said transparent layer having a rib cross-section with a thickness and width that permits the propagation of at least one TM-polarized mode in the waveguide structure and having a refractive index higher than that of the MO-active layer, the MO-active layer serving as part of the waveguide substrate.

16. The waveguide magneto-optical sensor element of claim 1 further including a superstrate made of transparent material having a lower refractive index than the other layers of the resonant waveguide structure and serving for optical confinement of the waveguide modes and physical protection of the waveguide structure.

17. The waveguide magneto-optical sensor element of claim 1 wherein said waveguide resonator comprises a waveguide Bragg grating, which converts the value of the magnetization projection in the plane of the MO film and perpendicular to the waveguide direction into a spectral shift of the Bragg spectral resonance feature.

18. The waveguide magneto-optical sensor element of claim 17 wherein said Bragg grating is formed in the waveguide structure by means of corrugation of the surface of at least one of the layers comprising the waveguide structure.

19. The waveguide magneto-optical element of claim 17 wherein said waveguide Bragg grating contains at least one phase shift.

20. The waveguide magneto-optical element of claim 17 wherein said Bragg grating comprises a superposition of two or more Bragg gratings having different periods.

21. The waveguide magneto-optical sensor element of claim 1 wherein said value and direction of magnetization of the MO-active layer is determined by an external magnetic field.

22. The waveguide magneto-optical sensor element of claim 21 wherein said external magnetic field is generated by the current in an electrical conductor.

23. The waveguide magneto-optical sensor element of claim 21 wherein said external magnetic field is the earth's magnetic field and said magneto- optical sensor element comprises a fiber-optic compass.

24. The waveguide magneto-optical sensor element of claim 23 wherein three sensor elements are disposed in mutually orthogonal positions in order to comprise a composite sensor that measures three orthogonal components of a magnetic field simultaneously.

25. The waveguide magneto-optical sensor element of claim 21 wherein said external magnetic field is generated by a permanent magnet and said magneto-optical sensor element comprises a fiber-optical speed and position measurement device.

26. The waveguide magneto-optical sensor element of claim 21 wherein said external magnetic field is generated by a permanent magnet and said magneto-optical sensor element comprises a fiber-optical moving surface position gage.

27. The waveguide magneto-optical sensor element of claim 1 wherein the said waveguide resonator exhibits spectrally distinct resonance spectral features for TM and TE polarized waveguide resonator modes and said TE spectral feature is used as a reference to enhance the separation of the magnetic signal from noise.

28. A waveguide magneto-optical sensor element comprising:

a substrate;

at least one layer of magneto-optically (MO) active material disposed thereon having predetermined magnetic and magneto-optical properties;

at least one waveguide structure supporting at least one TM-polarized waveguide mode that is at least partially localized within said at least one MO-active layer;

at least one waveguide resonator structure for a waveguide mode formed upon at least one magneto-optically active layer such that said waveguide mode is at least partially localized in at least one MO-active layer; said waveguide resonator exhibiting a characteristic resonant spectral feature in the transmitted and reflected waves, said waveguide resonator converting the value of the magnetization of said MO-active layer into a spectral shift of the characteristic spectral feature of said resonator; and a light coupler that couple light into and out of said waveguide magneto-optical sensor element, wherein said waveguide resonator comprises a ring-type of resonator, which converts the value of the magnetization projection perpendicular to the plane of the MO film into a spectral shift of the ring spectral resonance feature.

29. The waveguide magneto-optical sensor element of claim 28 wherein said waveguide ring resonator comprises at least one waveguide in a ring shape, evanescently coupled to at least one substantially straight waveguide for the purposes of delivering and removing the light to and from the ring.

30. The waveguide magneto-optical sensor element of claim 28 wherein said waveguide ring-type resonator comprises two or more ring-shaped waveguides, evanescently coupled to each other.

31. A waveguide magneto-optical sensor element comprising:
a substrate;
at least one layer of magneto-optically (MO) active material disposed thereon having predetermined magnetic and magneto-optical properties;
at least one waveguide structure supporting at least one TM-polarized waveguide mode that is at least partially localized within said at least one MO-active layer;
at least one waveguide resonator structure for a waveguide mode formed upon at least one magneto-optically active layer such that said waveguide mode is at least partially localized in at least one MO-active layer; said waveguide resonator exhibiting a characteristic resonant spectral feature in the transmitted and reflected waves, said waveguide resonator converting the value of the magnetization of said MO-active layer into a spectral shift of the characteristic spectral feature of said resonator; and
a light coupler that couples light into and out of said waveguide magneto-optical sensor element,
wherein said waveguide resonator comprises a ring-type of resonator, which converts the value of the nonuniformity of magnetization projection in the plane of MO the film into a spectral shift of the ring resonance feature.

32. A waveguide magneto-optical sensor element comprising:
a substrate;
at least one layer of magneto-optically (MO) active material disposed thereon having predetermined magnetic and magneto-optical properties;
at least one waveguide structure supporting at least one TM-polarized waveguide mode that is at least partially localized within said at least one MO-active layer;
at least one waveguide resonator structure for a waveguide mode formed upon at least one magneto-optically active layer such that said waveguide mode is at least partially localized in at least one MO-active layer; said waveguide resonator exhibiting a characteristic resonant spectral feature in the transmitted and reflected waves, said waveguide resonator converting the value of the magnetization of said MO-active layer into a spectral shift of the characteristic spectral feature of said resonator; and
a light coupler that couples light into and out of said waveguide magneto-optical sensor element,
wherein said waveguide resonator is a disk-type of resonator, which converts the value of the magnetization projection perpendicular to the plane of the MO film into a spectral shift of the disk resonance feature.

33. The waveguide magneto-optical sensor element of claim 32 wherein said waveguide disk resonator, which converts the value of nonuniformity of the magnetization projection in the plane of the MO film into the spectral shift of the disc spectral resonance feature.

* * * * *